United States Patent [19]

Otsubo et al.

[11] Patent Number: 4,808,258

[45] Date of Patent: Feb. 28, 1989

[54] PLASMA PROCESSING METHOD AND APPARATUS FOR CARRYING OUT THE SAME

[75] Inventors: Toru Otsubo, Fujisawa; Susumu Aiuchi, Yokohama; Takashi Kamimura, Yokohama; Minoru Noguchi, Yokohama; Teru Fujii, Chigasaki, all of Japan

[73] Assignee: Hitachi, Ltd., Tokyo, Japan

[21] Appl. No.: 662,014

[22] Filed: Oct. 18, 1984

[30] Foreign Application Priority Data

Oct. 19, 1983 [JP] Japan ................................ 58-194311
Jun. 29, 1984 [JP] Japan ................................ 59-133117

[51] Int. Cl.$^4$ ..................... C23F 01/02; H01L 21/306
[52] U.S. Cl. ..................................... 156/643; 156/345; 204/192.32; 204/298
[58] Field of Search ............... 156/345, 643, 653, 656, 156/657; 204/192.32, 298; 148/DIG. 131

[56] References Cited

U.S. PATENT DOCUMENTS

| | | | |
|---|---|---|---|
| 3,677,799 | 7/1972 | Hou | 427/38 |
| 4,233,109 | 10/1980 | Nishizawa | 156/643 |
| 4,298,419 | 11/1981 | Suzuki et al. | 156/345 |
| 4,349,409 | 9/1982 | Shibayama et al. | 156/345 X |
| 4,352,725 | 10/1982 | Tsukada | 204/192 E |
| 4,464,223 | 8/1984 | Gorin | 204/298 X |
| 4,496,448 | 1/1985 | Tai et al. | 156/643 X |
| 4,579,623 | 4/1986 | Suzuki et al. | 156/345 X |
| 4,585,516 | 4/1986 | Corn et al. | 156/643 |

FOREIGN PATENT DOCUMENTS

| | | | |
|---|---|---|---|
| 0139835 | 5/1985 | European Pat. Off. | |
| 56-33839 | 4/1981 | Japan | 156/345 |
| 58-100430 | 6/1983 | Japan | 156/345 |
| 2056919 | 3/1981 | United Kingdom. | |

OTHER PUBLICATIONS

Bruce, R. H., "Anisotropy Control In Dry Etching", Solid State Techn., vol. 24, No. 10, Oct. 1981, pp. 64–68.
Patent Abstracts of Japan, vol. 5, No. 160 (C-75)[832], Oct. 15, 1981; JP-A-56-90978 (Fujitsu) 23-07-1981.

Primary Examiner—Michael W. Ball
Assistant Examiner—Ramon R. Hoch
Attorney, Agent, or Firm—Antonelli, Terry & Wands

[57] ABSTRACT

A plasma processing method and an apparatus for carrying out the method in which a processing gas is introduced into a processing chamber, and periodically an amplitude modulated or frequency-modulated high-frequency voltage is applied to plasma generating means, to generate a discharge plasma and to carry out predetermined processing by the plasma.

30 Claims, 13 Drawing Sheets

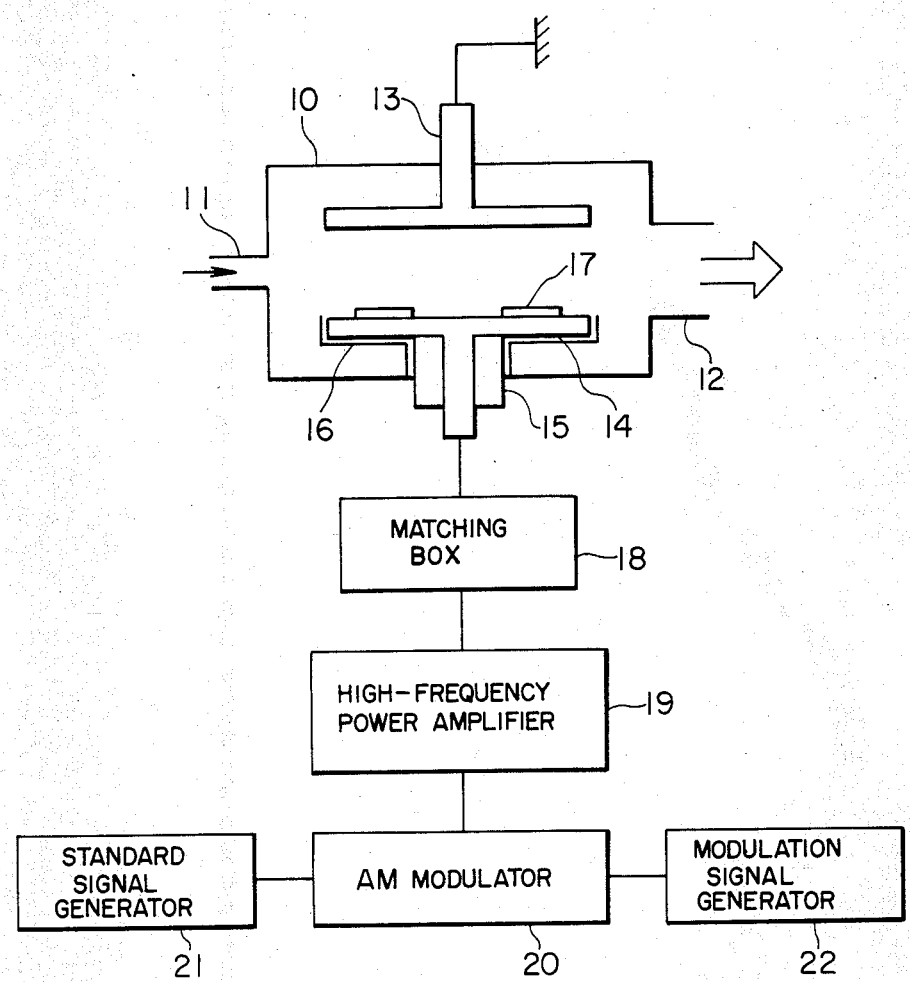

BEFORE ETCHING

AFTER ETCHING

BEFORE ETCHING

AFTER ETCHING

PLASMA PROCESSING METHOD AND APPARATUS FOR CARRYING OUT THE SAME

The present invention relates to a plasma processing method suitable for the fabrication of semiconductor devices, and to an apparatus for carrying out the plasma processing method.

The plasma processing is carried out, for example, in such a manner that a processing gas is introduced into an evacuated processing chamber, and then a plasma is generated by applying a high-frequency voltage between parallel plate electrodes, to carry out desired processing. The processing carried out as above includes the dry etching in which an ion or radical produced from the processing gas by the plasma etches a film in accordance with a pattern formed by a resist film, the plasma chemical vapor deposition in which the processing gas is decomposed by the plasma to deposit a film on a substrate, and the plasma polymerization in which the processing gas is polymerized by the plasma to deposit a film on a substrate.

Recently, in order to enhance the degree of integration in a semiconductor device and to reduce the cost of a solar cell, these plasma processing techniques have been widely used in fabrication processes. Further, in order to improve the production yield, high-level processing characteristics are now required. For example, in the dry etching, it is required to increase the etching rate, thereby enhancing the productivity, to make large the selectivity (that is, a ratio of the etching rate for a desired film to the etching rate for a layer underlying the film), thereby improving the production, yield, and to etch a semiconductor layer so as to form a fine pattern with satisfactory accuracy.

In the conventional plasma processing, the etching characteristics and the characteristics of deposited film have been controlled by changing the kind, pressure and flow rate of the processing gas, and the high-frequency power for generating the plasma.

However, satisfactory characteristics have not been obtained by controlling such factors. For example, the dry etching encounters the following problems.

Firstly, when the pressure of the processing gas is made high, the selection ratio is improved, but the etching accuracy is lowered.

Secondly, when the high-frequency power is increased, the etching rate becomes high, but the selectivity is reduced.

It is an object of the present invention to provide a plasma processing method in which all of plasma processing characteristics such as the film deposition rate, film quality, etching rate, selectivity and etching accuracy are improved. In the conventional plasma processing method, the film deposition rate conflicts with the film quality, and the etching rate, selectivity and etching accuracy conflict with each other. Further, it is another object of the present invention is to provide an apparatus for carrying out such a plasma processing method.

In order to attain the above objects, according to the present invention, a high-frequency voltage having a frequency of more than $10^2$ Hz (preferably, of the order of 1 MHz) for generating a plasma is periodically modulated to control ion energy distribution and/or electron temperature distribution, thereby adjusting the amount and kind of each of the ion and radical formed in the plasma. Thus, one of the etching rate, selectivity and etching accuracy is remarkably improved in an etching process without making smaller the remaining ones of these factors, as compared with a conventional etching process, and further either the film deposition rate or the film quality is improved in a film deposition process.

It is preferred that the modulation frequency lies in a range from 10 to 10,000 Hz. For the reason that the amplitude modulation is easy to control, the amplitude modulation is superior to the frequency modulation. In the amplitude modulation, it is most desirable to change the amplitude of the high-frequency voltage stepwise, since a processing condition can be readily set. That is, the desired processing condition can be readily obtained by making the optimum combination of a repetition period $(t_1+t_2)$ of the modulation, a ratio $t_1/t_2$, and an amplitude ratio $V_3/V_2$, where $t_1$ indicates a period when the high-frequency voltage has a small amplitude $V_2$, and $t_2$ a period when the voltage has a large amplitude $V_3$.

The above the other objects, features and advantages of the present invention will be apparent from the following detailed description of the preferred embodiments of the invention taken in conjunction with the accompanying drawings, in which:

FIG. 8 is a block diagram showing an embodiment of an apparatus for carrying out plasma processing (hereinafter referred to as a "plasma processing apparatus"), according to the present invention, of which embodiment is of the amplitude modulation type;

Prior to explaining a plasma processing method and a plasma processing apparatus according to the present invention, a conventional plasma etching method will be explained below.

Figure 16A:
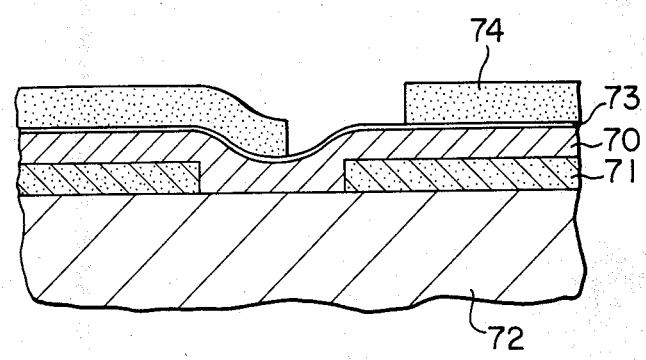
Figure 16B:
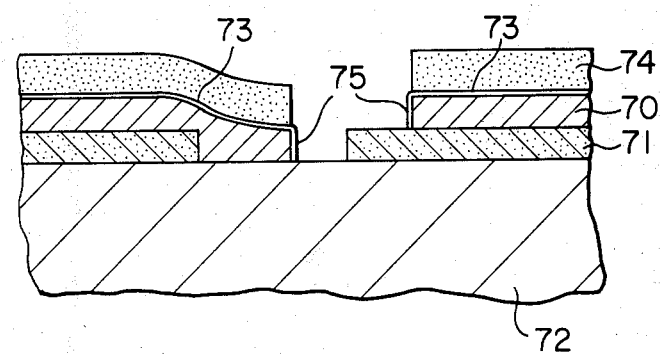

In the conventional dry etching method in which a high-frequency voltage having a frequency of 0.5 to 20 MHz (for example, 13.56 MHz) is applied between parallel plate electrodes, the ion energy distribution and electron temperature distribution are determined by the gas pressure and high-frequency power. When an aluminum film 70 is etched to form a wiring pattern as shown in FIGS. 16A and 16B, a high-energy ion is not required for etching the aluminum film 70, but is necessary for etching a phosphosilicate glass film 71 or silicon layer 72 underlying the aluminum film 70. Accordingly, the selectivity (a ratio of the etching rate for the aluminum film to the etching rate for the underlying material) can be enhanced by reducing the ion energy.

However, a high-energy ion is indispensable for removing an aluminum oxide film 73 on aluminum surface and for forming a side wall 75 which makes it possible to etch the aluminum film pattern with high accuracy. The side wall 75 is formed of a polymerized-material film or deposited film, and can prevent the side etching caused by a carbon-containing gas which is generated by bombarding a resist film 74 with an ion.

Figure 1:
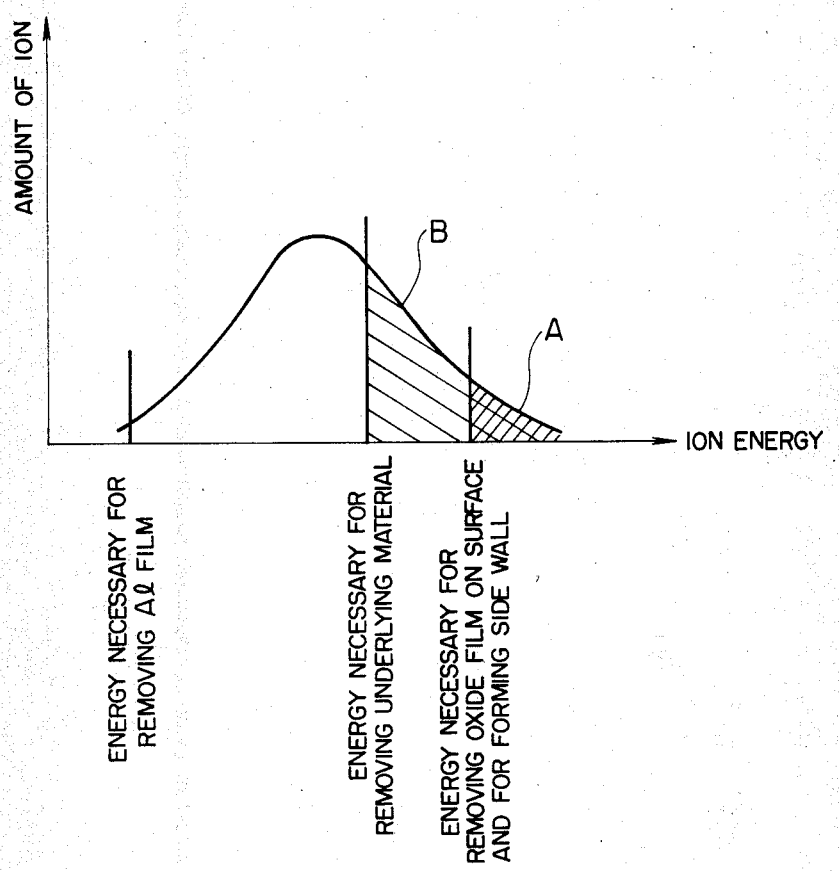
FIG. 1 is a graph showing the ion energy distribution in the conventional plasma processing using parallel plate electrodes.

FIG. 1 schematically shows the ion energy distribution in a conventional plasma etching method.

Referring to FIG. 1, the ion lying in a region A is indispensable for the removal of the aluminum oxide film and the formation of the side wall, and a large amount of ion lying in a region B adjacent to the region A would etch an underlying material. Accordingly, it is impossible to make the selectivity sufficiently large.

Figure 2:
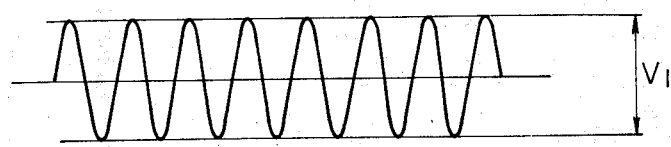
FIG. 2 is a waveform chart showing a high-frequency voltage used in the conventional plasma processing.
Figure 3:
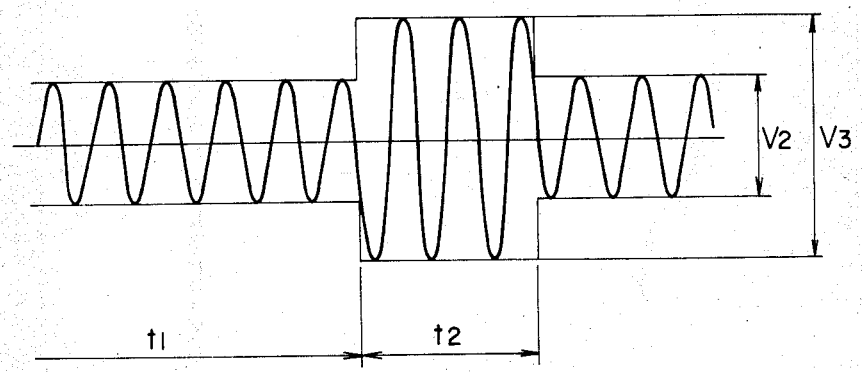
FIG. 3 is a waveform chart showing an example of an amplitude-modulated high-frequency voltage according to the present invention.

In order to solve this problem, according to the present invention, an amplitude-modulated high-frequency voltage shown in FIG. 3 is used in place of a conventional high-frequency voltage shown in FIG. 2.

Now, a plasma processing method according to the present invention which uses an amplitude-modulated high-frequency voltage will be explained below, with reference to FIG. 3. In this method, a gas pressure is made higher, as compared with the conventional plasma processing method. Further, a high-frequency voltage $V_2$ lower than the conventional voltage $V_1$ (shown in FIG. 2) is applied between electrodes for a period $t_1$, as shown in FIG. 3. Since the gas pressure is high, the ion energy at the period $t_1$ is low, but the discharge current is increased at this period. Accordingly, the energy of an electron flowing from each electrode to a plasma is lowered, but the number of such electrons is increased. Thus, the production of a radical which contributes to etching, is also increased.

At a period $t_2$, a high-frequency voltage $V_3$ higher than the conventional voltage $V_1$ is applied between the electrodes, under a high gas pressure. Thus, ion energy necessary for removing the aluminum oxide film and for forming the side wall is obtained. The ion energy distribution in the above case is schematically shown in FIG. 4.

Figure 4:
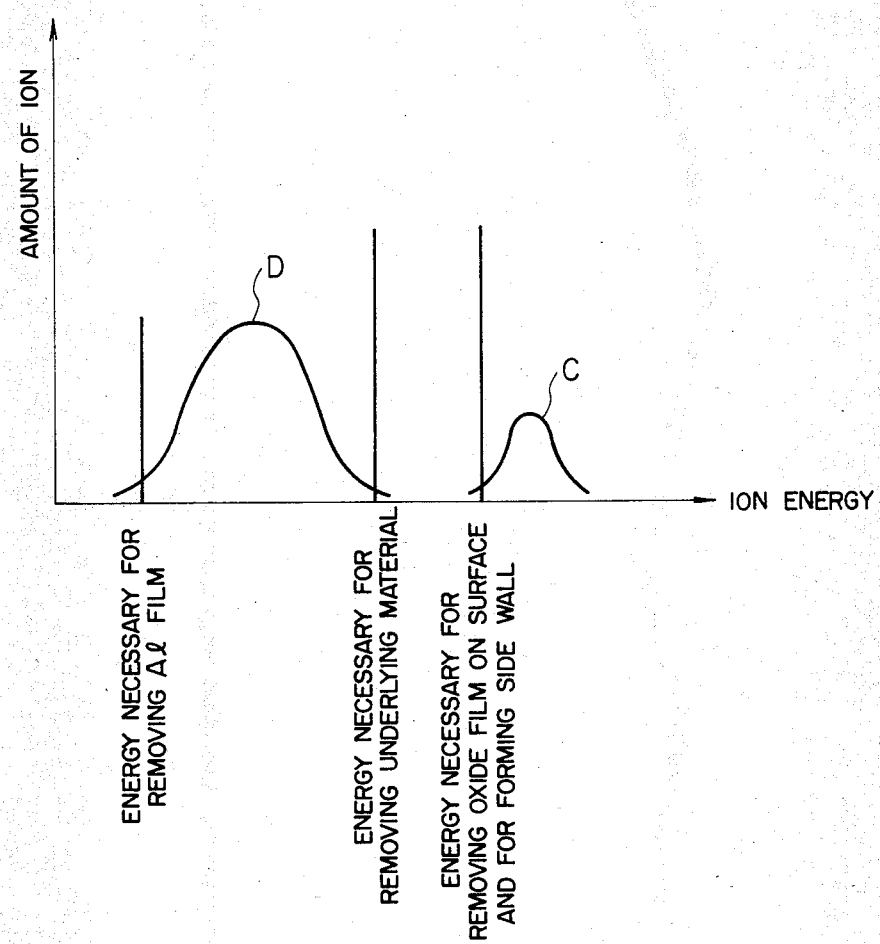
FIG. 4 is a graph showing the ion energy distribution obtained when the amplitude-modulated high-frequency voltage of FIG. 3 is used.

Referring to FIG. 4, a large amount of low-energy ion or radical is generated by the discharge at the period $t_1$, as indicated by a curve D. Thus, the etching rate is increased. While, a high-energy ion is generated by the discharge at the period $t_2$, as indicated by a curve C. The amount and energy of the high-energy ion can be controlled by changing a ratio $t_1/t_2$ and the voltage $V_3$. (Preferably, the ratio $t_1/t_2$ is put in a range of about 1 to 20, and a ratio $V_3/V_2$ is put in a range of about 1.2 to 4.) The ion quantity and ion energy indicated by the curve C can be decreased to the irreducible minimum, in the above manner.

Figure 5:
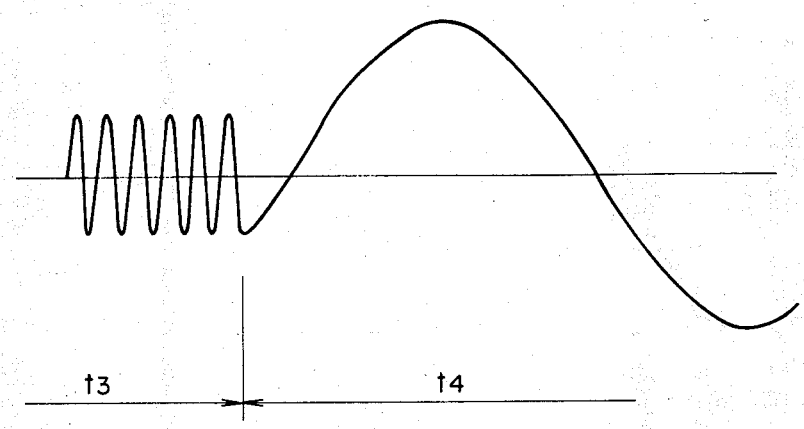
FIG. 5 is a waveform chart showing an example of a frequency-modulated high-frequency voltage according to the present invention.

In the above, explanation has been made on the case where a high-frequency voltage is amplitude-modulated. However, the same effect as in this case, can be obtained in the case where a high-frequency voltage is frequency-modulated as shown in FIG. 5. Referring to FIG. 5, a high-frequency voltage having a frequency of 13.56 MHz at a period $t_3$ is frequency-modulated at a period $t_4$ so as to have a frequency of 1 MHz. Thus, at the period $t_4$, the discharge voltage becomes higher, and the ion energy is increased. It is to be noted that the frequency modulation is hard to control.

Figure 6:
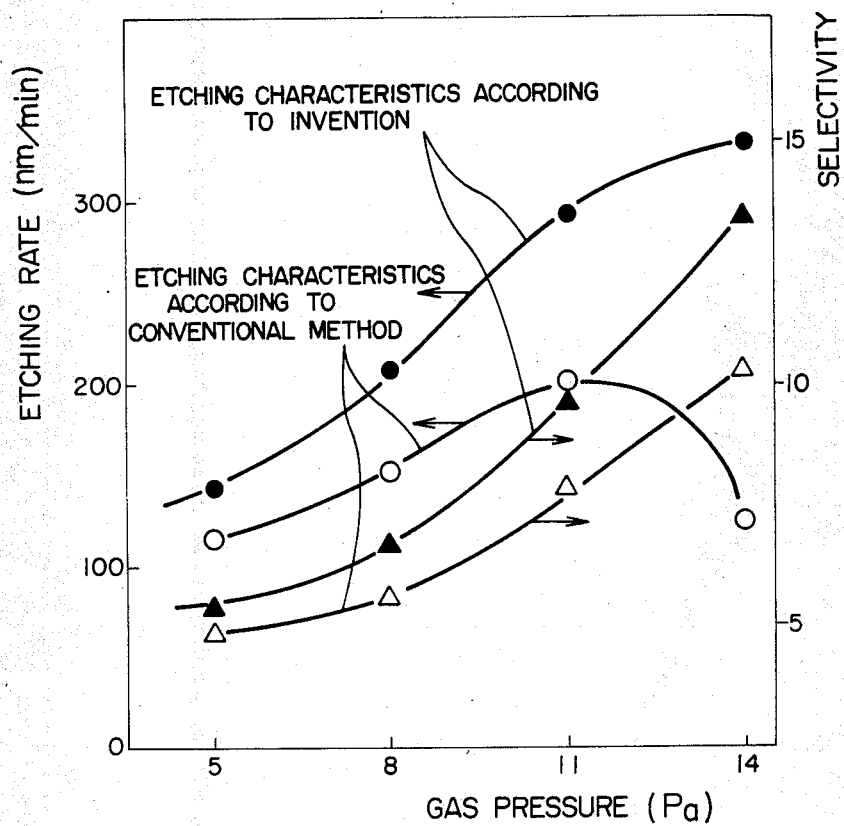
FIG. 6 is a graph for comparing etching characteristics according to the present invention will those in the conventional plasma etching.

FIG. 6 shows etching characteristics obtained by a plasma etching method according to the present invention which uses the amplitude-modulated high-frequency shown in FIG. 3, and etching characteristics obtained by a conventional plasma etching method. As is apparent from FIG. 6, the plasma etching method according to the present invention is far superior to the conventional plasma etching method.

Figure 17A:
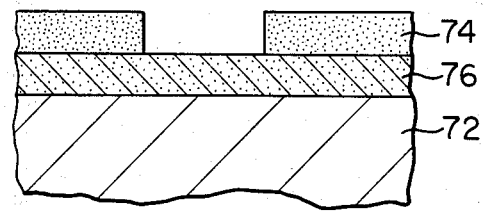
FIGS. 17A and 17B are schematic sectional views for a process of etching an oxide film.
Figure 17B:
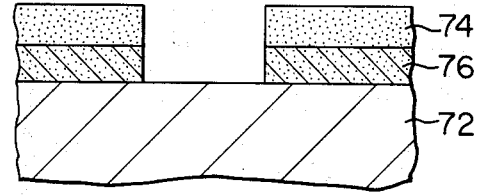

Next, as shown in FIGS. 17A and 17B, another example of plasma etching, that is, the case where a silicon oxide film 76 on a silicon wafer 72 is etched, will be explained below. In order not to advance the etching for the silicon wafer 72 after the etching for the silicon oxide film 76 has been completed, it is desirable to make the difference between the etching speed for the silicon oxide film and the etching speed for silicon, as large as possible. When compared with the silicon oxide film 76, silicon 72 is etched by a low-energy ion. Accordingly, in order to enhance the selectivity, that is, a ratio of the etching rate for the silicon oxide film 76 to the etching rate for silicon 72, the ion for etching is required to have energy greater than a value necessary for etching the silicon oxide film 76. The ion energy can be enhanced either by lowering the gas pressure or by increasing the high-frequency power supplied to the plasma.

However, when the gas pressure is lowered, the ion energy is enhanced, but the ionization efficiency is lowered, which reduces the etching rate. When the high-frequency power is increased, not only the ion energy is enhanced, but also the amount of heat generated by ion bombardment is increased. Thus, the temperature of the wafer is elevated.

When a pattern is formed in a wafer for a semiconductor device, a resist pattern 74 is formed on the wafer before an etching process. The resist film 74 softens at a temperature of about 120° C. or more, and thus the resist pattern 74 is deformed, which makes it impossible to etch the pattern in wafer with high accuracy. In some cases, there arises a problem that the resist film changes in quality and it becomes impossible to completely remove the resist film after the etching process.

Figure 7:
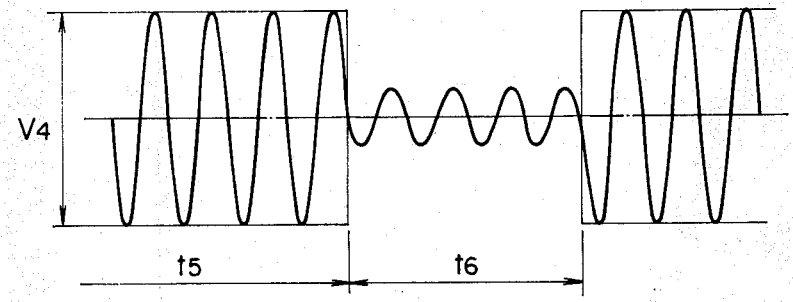
FIG. 7 is a waveform chart showing an amplitude-modulated high-frequency voltage according to the present invention for etching a silicon oxide film.

According to the present invention, as shown in FIG. 7, a high-frequency voltage $V_4$ higher than the conventional high-frequency voltage is applied for a period of $t_5$ sec., and the amplitude of the voltage $V_4$ is reduced for a period of $t_6$ sec. That is, an amplitude-modulated high-frequency voltage is used. It is to be noted that the averaged amplitude of the high-frequency voltage $V_4$ at a period of $(t_5+t_6)$ sec. is made substantially equal to the constant amplitude of the conventional high-frequency voltage.

As mentioned previously, the ion energy for etching a silicon oxide film 76 is higher than the ion energy for etching silicon 72. In order to make large the etching rate and selectivity, it is required that the ion energy is distributed in a range higher than a level necessary for etching the silicon oxide film 76.

In a discharge according to the present invention, the high-frequency voltage $V_4$ has a large amplitude at the period $t_5$ so that a high-energy ion is incident on the wafer, and has a small amplitude at the period $t_6$ so that the ion energy is smaller than a level necessary for etching silicon 72. Since the modulation frequency (one cycle consisting of periods $t_5$ to $t_6$) exceeds 10 Hz, the above phenomena can be considered to occur substantially simultaneously, and hence, ion groups having at least different means energies as indicated are incident on the wafer.

Since the high-frequency power supplied by the voltage $V_4$ havng such a waveform is equivalent to the conventional high-frequency power, the resist film 74 never softens. In other words, the ion energy is distributed in a high energy range, without softening the resist film formed on the wafer. Thus, the etching rate can be made 2.5 times as large as the conventional etching rate, and the selectivity can be made 1.8 times as large as the conventional selectivity. Besides the present method is applied to etching for gate wiring, a multilayer film and a single crystal silicon, etc.

In the above, the plasma etching has been explained. However, the present invention can exhibit a similar effect in the plasma chemical vapor deposition or plasma polymerization. The characteristics of a film deposited by the above techniques are dependent upon the electron temperature in the plasma, the energy of ion incident on a substrate, and the ion and radical produced in the vicinity of an ion sheath. The electron temperature distribution in the plasma, the kind of each of the ion and radical produced in the plasma, and the ratio between the amount of the ion and the amount of the radical, can be controlled by modulating a high-frequency voltage in the same manner as having been explained with respect to the plasma etching. Accordingly, when conditions for depositing a film having excellent characteristics are known, the discharge plasma is controlled by a modulated high-frequency voltage according to the present invention so that the above conditions are satisfied. Thus, the processing characteristics with respect to the film deposition can be improved.

In the above explanation, a high-frequency voltage having a frequency of 13.56 MHz has been used. However, the frequency of the high-frequency voltage is not limited to the above value, but may be other values capable of generating and maintaining a discharge.

One cycle of the modulation frequency is made far smaller than a plasma processing time of 1 to tens of min., that is, may be such that the plasma processing can be stopped at a desired processing time without making any difference in processing condition. In view of the above, the frequency of a high-frequency voltage is put in a range exceeding $10^2$ Hz (that is, the frequency is made equal to, for example, 13.56 MHz, 27.12 MHz, 54.24 MHz and so on, and a frequency of 2.45 GHz is used when a microwave plasma is formed), and the modulation frequency is put in a range exceeding 10 Hz (preferably, in a range of about 10 Hz to 10 KHz).

In the above, the plasma etching, plasma chemical vapor deposition and plasma polymerization which use parallel plate electrodes, have been explained. However, the present invention is not limited to such construction, but is applicable to the plasma processing using an external electrode of capacitance coupling or inductance coupling type and the plasma processing utilizing a plasma generated by a microwave and the electron cyclotron resonance. In these cases, although no electrode exists in a processing chamber, the high-frequency or microwave power supplied to a plasma is controlled to control the electron temperature distribution in the plasma, thereby adjusting the kind and amount of each of the ion and radical produced in the plasma. Thus, various characteristics of plasma processing can be controlled.

Further, in the above explanation, the high-frequency power supplied to a plasma is modulated with a rectangular wave. However, the modulation waveform is not limited to the rectangular wave. In other words, when a desired ion energy distribution, a desired electron temperature distribution, and a desired ratio between the amount of the desired ion and the amount of the desired radical, are known, the modulation waveform is determined in accordance with these factors. The use of a rectangular wave as the modulation waveform has an advantage that a processing condition can be readily set and the plasma processing can be readily controlled.

Now, explanation will be made on embodiments of a plasma processing apparatus for carrying out the above-mentioned plasma processing method.

FIG. 8 shows, in block, an embodiment of a plasma processing apparatus according to the present invention, of which embodiment is of the cathode coupling type and is used for etching an aluminum film or silicon oxide film by means of an amplitude-modulated discharge.

Referring to FIG. 8, a processing chamber 10 is provided with a gas inlet 11 for introducing a processing gas into the chamber 10, and a gas outlet 12. Further, an earth electrode (namely, a grounded electrode) 13 and a high-frequency electrode 14 are disposed in the processing chamber 10. The high-frequency electrode 14 is fixed to the wall of the chamber 10 through an insulating bushing 15, and a shield case 16 for preventing the discharge between the electrode 14 and the inner surface of the chamber 10 is provided around the electrode 14. The high-frequency electrode 14 is connected to a high-frequency power amplifier 19 through a matching box 18. A signal having a frequency of 13.56 MHz from a standard signal generator 21 is amplitude-modulated by an amplitude modulator 20 in accordance with a signal from a modulation signal generator 22, and then applied to the high-frequency power amplifier 19.

The modulation signal generator 22 can generate various waveforms such as a rectangular wave and a sinusoidal wave, and moreover can change the period and amplitude of such waveforms. It is to be noted that since the rectangular wave modulates the signal from the standard signal generator 21 in a discrete fashion, the rectangular wave can readily set the processing condition, as compared with the sinusoidal wave and the compound wave of it.

The modulation signal generator 22 generates a modulation signal for modulating the signal having a frequency of 13.56 MHz from the standard signal generator 21 in accordance with predetermined plasma processing so that an amplitude-modulated signal such as shown in FIG. 3 or 7 is obtained. The amplitude-modulated signal thus obtained is applied to the high-frequency power amplifier 19. A signal having a waveform such as shown in FIG. 3 or 7 is delivered from the high-frequency power amplifier 19, and applied to the electrode 14 through the matching box 18. Since the amplitude-modulated signal is applied to the amplifier 19, the frequency of the output signal of the amplifier 19 is kept constant. Accordingly, desired matching can be made for the output signal of the amplifier 19 by the matching box 18 for 13.56 MHz.

As can be seen from the above, the present embodiment can generate a discharge plasma which has been explained in the plasma processing method according to the present invention, and thus can carry out satisfactory plasma processing.

A plasma processing apparatus of the anode coupling type for carrying out the plasma etching and plasma chemical vapor deposition can be realized by exchanging the positions of the earth electrode 13 and electrode 14 shown in FIG. 8.

Figure 9:
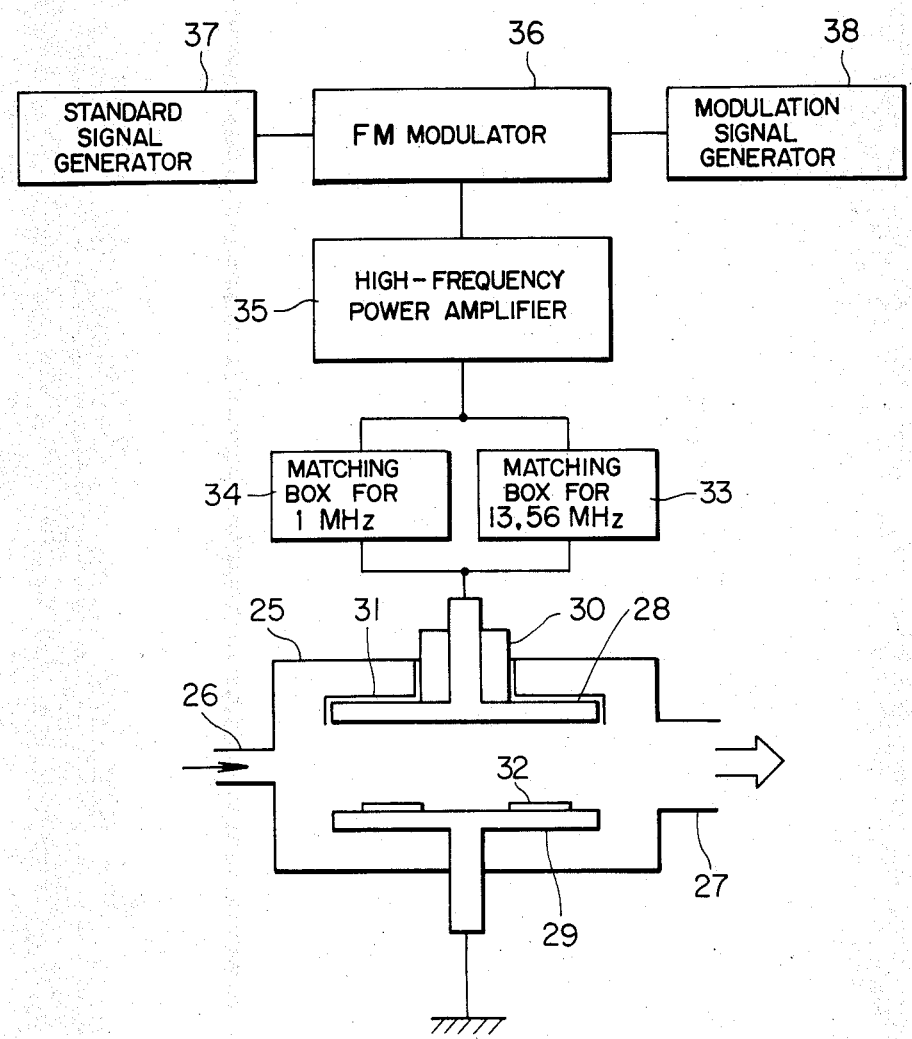
FIG. 9 is a block diagram showing another embodiment of a plasma processing apparatus according to the present invention, of which embodiment is of the frequency modulation type.

FIG. 9 shows another embodiment of a plasma processing apparatus according to the present invention, of which embodiment is of the anode coupling type and uses a frequency-modulated high-frequency signal.

Referring to FIG. 9, a processing chamber 25 is provided with a gas inlet 26 for introducing a processing gas into the chamber 25, and a gas outlet 27. Further, an electrode 28 provided with an insulating bushing 30 and a shield case 31 is disposed in an upper part of the processing chamber 25, and an earth electrode 29 is disposed in a lower part of the chamber 25.

A wafer 32 is placed on the earth electrode 29, and the electrode 28 is connected to a high-frequency power amplifier 35 through a matching box 33 for 13.56 MHz and a matching box 34 for 1 MHz which are connected in parallel.

A signal having a frequency of 13.56 MHz from a standard signal generator 37 is modulated by a frequency modulator 36 so as to include a signal part having a frequency of 13.56 MHz and a signal part having a frequency of 1 MHz, in accordance with a signal from a modulation signal generator 38. A ratio of the signal part having a frequency of 13.56 MHz to the signal part having a frequency of 1 MHz can be freely set by the modulation signal. The frequency-modulated signal from the modulator 36 is amplified by the power amplifier 35. Then, the signal part having a frequency of 13.56 MHz is sent to the electrode 28 through the matching box 33 for 13.56 MHz, and the signal part having a frequency of 1 MHz is sent to the electrode 28 through the matching box 34 to 1 MHz. Thus, a modulated high-frequency discharge is generated between the electrodes 28 and 29, and the plasma processing can be performed.

In the present embodiment, the frequency-modulated high-frequency signal is generated by the frequency modulator 36. However, the generation of the frequency-modulated signal is not limited to the above method, but such a signal may be produced by a device shown in FIG. 10.

Figure 10:
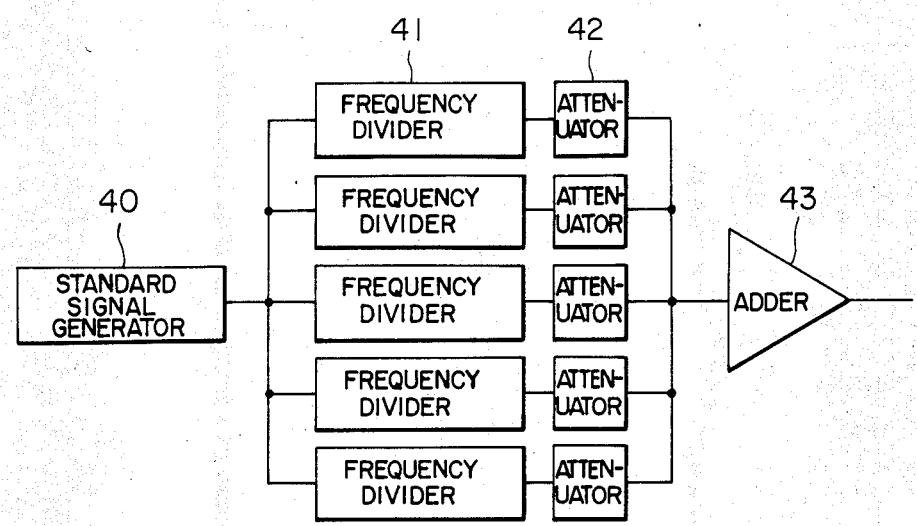
FIG. 10 is a block diagram showing an example of a device for generating a frequency-modulated signal.

Referring to FIG. 10, a high-frequency signal from a standard signal generator 40 is applied to frequency dividers 41 different, in demultiplication factor form each other, and the outputs of the frequency dividers are individually varied by attenuators 42. The outputs of the attenuators 42 are applied to an adder 43, to obtain a signal having a plurality of frequencies. In the case where an appropriate number of frequency dividers 41 are provided and the frequency dividers are connected to the attenuator 42 in one-to-one correspondence, the device shown in FIG. 10 can produce substantially the same signal as do the frequency modulator 36 and the amplitude modulator 20.

In the case where parallel plate electrodes are provided in a processing chamber as shown in FIGS. 8 and 9, the high-frequency voltage applied between the electrodes has a function of generating a discharge for putting the processing gas in a plasma state, and another function of accelerating an ion formed in the plasma.

Next, explanation will be made on the case where discharge means for producing a plasma and acceleration means for accelerating an ion in the plasma can be separately provided.

Figure 11:
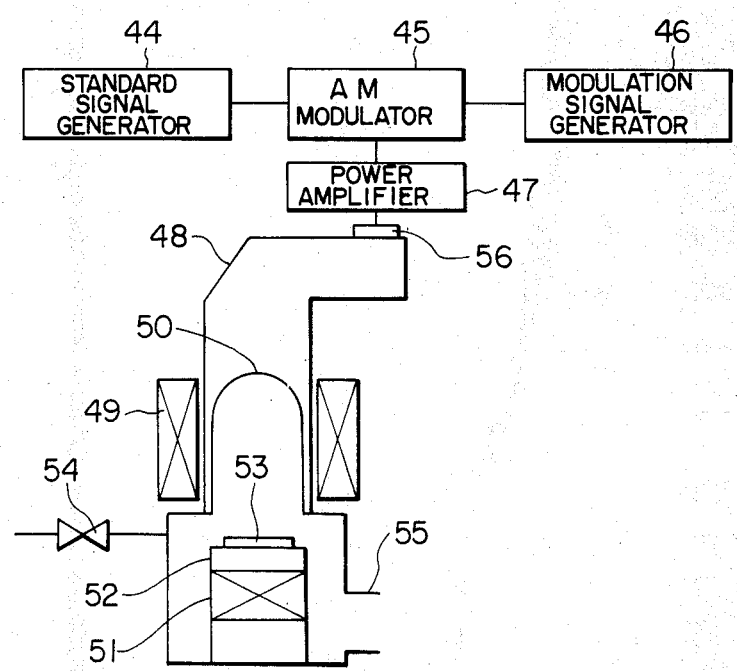
FIG. 11 is a block diagram showing a further embodiment of a plasma processing apparatus according to the present invention, of which embodiment is of the electron cyclotron resonance type.

FIG. 11 shows a further embodiment of a plasma processing apparatus according to the present invention, of which embodiment is of the electron cyclotron resonance type.

Referring to FIG. 11, a signal having a frequency of 2.45 GHz from a standard signal generator 44 is modulated by an amplitude modulator 45 in accordance with a signal from a modulation signal generator 46. The signal thus modulated is amplified by a power amplifier 47, and then applied to a magnetron 56 which is mounted on an end portion of a waveguide 48, to be converted into a microwave. The amplitude-modulated microwave passes through the waveguide 48, and is then introduced into a processing chamber 50 bounded by a quartz wall. Coins 49 and 50 each for generating a magnetic field are provided around the processing chamber 50. A plasma is generated by the resonance of the electron motion with the microwave and magnetic field. At this time, the electron energy depends upon the intensity of the microwave introduced into the chamber 50. Accordingly, the electron temperature distribution can be controlled by the above modulation. Thus, the kind and amount of each of the ion and radical produced in the plasma, can be adjusted by the modulation. Accordingly, it is possible to control the etching characteristics of a plasma etching apparatus of the electron cyclotron resonance type, and to control the quality of a film formed by a plasma chemical vapor deposition apparatus of the electron cyclotron resonance type. Incidentally, in FIG. 11, reference numeral 54 designates a gas feed pipe for introducing a processing gas into the processing chamber 50, 55 an exhaust pipe, 52 a stage, and 55 a substrate.

Figure 12:
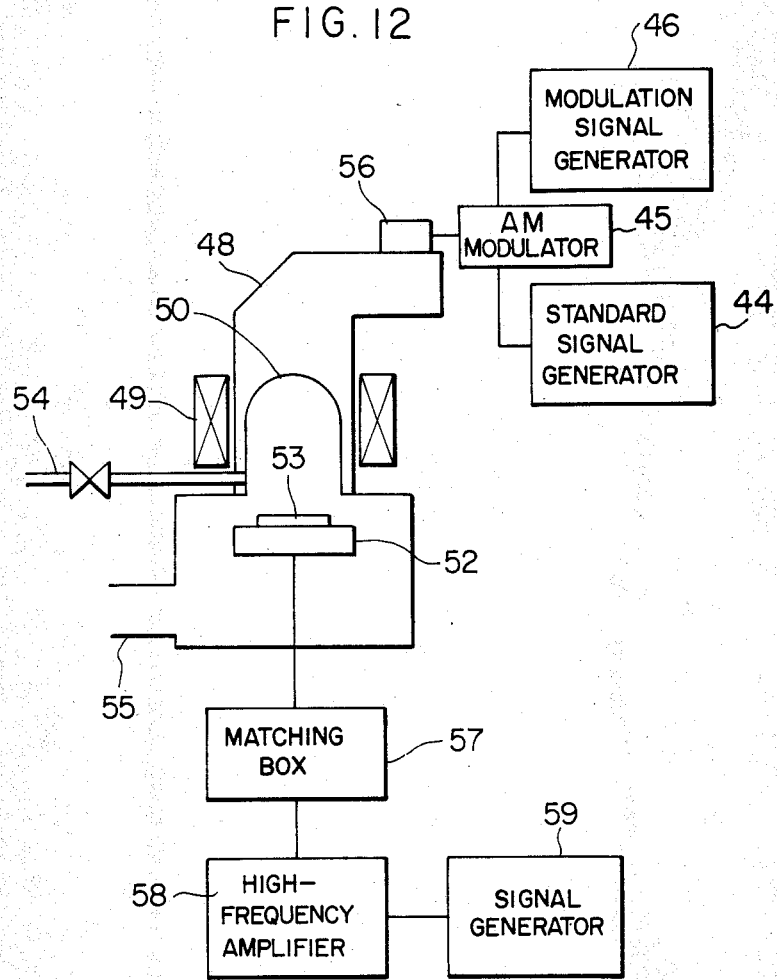
FIG. 12 is a block diagram showing still another embodiment of a plasma processing apparatus according to the present invention.

FIG. 12 shows still another embodiment of a plasma processing apparatus according to the present invention.

Referring to FIG. 12, a waveguide 48 and a magnet 49 are provided around a processing chamber 50, and a magnetron 56 mounted on an end portion of the waveguide 48 is connected to a driving power source 44 and a control power source 46 which serves as discharge modulating means. A high-frequency voltage from a signal generator 59 is applied to a stage 52 which is disposed in the processing chamber 50, through a high-frequency amplifier 58 and a matching box 57. Further, a gas feed pipe 55 from processing gas supply means (not shown) and an exhaust pipe 55 from evacuating means (not shown) are connected to the processing chamber 50. In order to generate a plasma in the processing chamber 50, a predetermined amount of processing gas is introduced into the chamber 50 through the gas feed pipe 54, while evacuating the chamber 50 through the exhaust pipe 55. Thus, the pressure of the chamber 50 is kept at a predetermined value within a range from $1 \times 10^{-4}$ to 10 Torr. When the magnetron 56 is operated with the driving power source 44 in the above state, a microwave generated by the magnetron 56 passes through the waveguide 48 and is introduced into the processing chamber 50. In the chamber 50, the electron cyclotron resonance is caused by the microwave thus introduced and a magnetic field formed by the magnet 49. Thus, an intense plasma is generated in the processing chamber 50.

Figure 13:
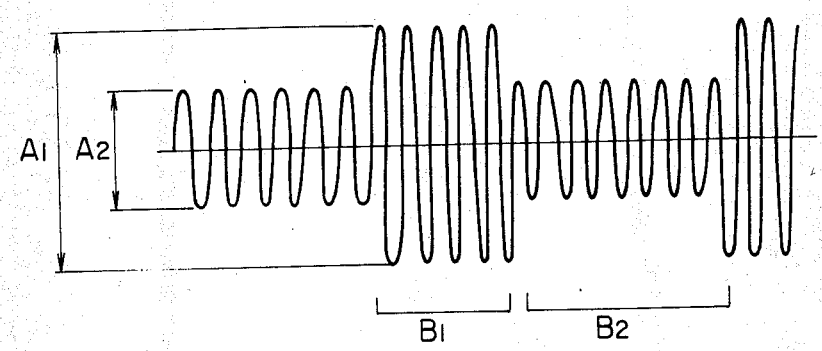
FIG. 13 is a waveform chart showing an amplitude-modulated output of the magnetron shown in FIG. 12.

At this time, the output of the magnetron 56 can be amplitude-modulated with a control signal from the control power source 46, as shown in FIG. 13. In a period $B_1$ when the microwave has an amplitude $A_1$, the field intensity in the plasma is strong, and an electron makes a high-speed cyclotron motion. Thus, the electron temperature is elevated. While, in a period $B_2$ when the microwave has an amplitude $A_2$, the above field intensity is weak, and an electron makes a low-speed cyclotron motion. Thus, the electron temperature is lowered. Accordingly, the electron temperature distribution can be freely controlled by changing the amplitudes $A_1$ and $A_2$ and a ratio of the period $B_1$ to the period $B_2$.

Now, let us suppose that an ion C and a radical D are required for the plasma processing. A high electron temperature is necessary for generating the ion C, and the radical D is produced at a low electron temperature. Accordingly, the ion C and radical D can be produced in the plasma in an optimum state, by setting the amplitude $A_1$ to a value suitable for generating the ion C, by setting the amplitude $A_2$ to a value suitable for producing the radical D, and by setting the period $B_1$ and $B_2$ in accordance with a desired ratio between the amount of ion C and the amount of the radical D.

Further, such a signal as shown in FIG. 13 is generated by the signal generator 59, and then applied to the stage 52 through the high-frequency amplifier 58 and matching box 57. Thus, the ion in the plasma is accelerated in accordance with the amplitude of the signal applied to the stage 52, and then impinges on a wafer 53. In the period $B_1$ when the output signal of the signal generator 59 has the amplitude $A_1$, the ion is accelerated by a strong electric field, and the ion energy becomes large. While, in the period $B_2$ when the above output signal has the amplitude $A_2$, the ion accelerating electric field is weak, and therefore the ion energy is small. That is, the ion energy can be controlled by the amplitudes $A_1$ and $A_2$. Further, a ratio of the amount of high-energy ion to the amount of low-energy ion can be controlled by changing a ratio of the period $B_1$ to the period $B_2$. In other words, the ion energy distribution can be controlled by the amplitude-modulated high-frequency signal delivered from the signal generator 59.

In the present embodiment, two amplitudes $A_1$ and $A_2$ and two periods $B_1$ and $B_2$ have been used. However, the present invention is not limited to such a case, each of the amplitude and period can take various values to obtain a high-frequency signal which is amplitude-modulated in a desired manner.

Figure 14:
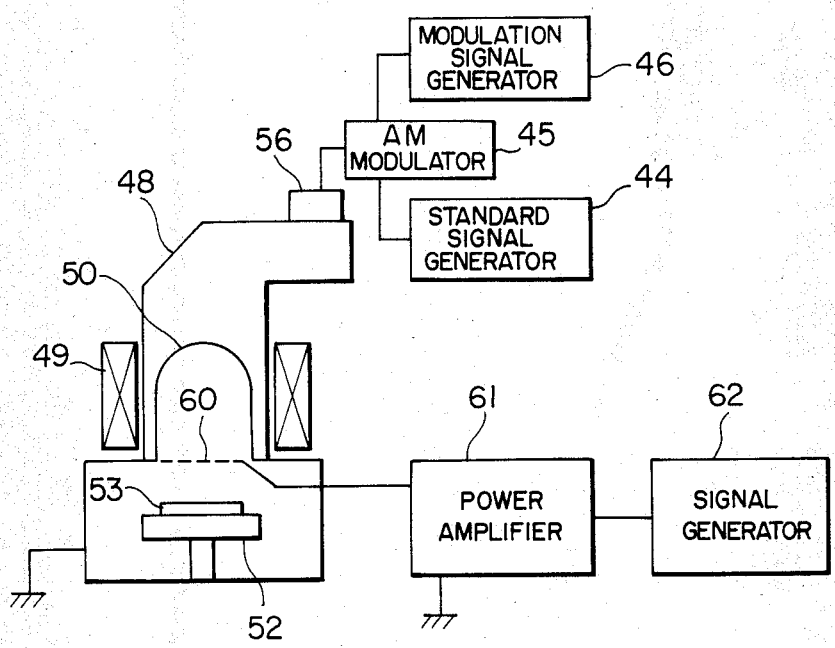
FIG. 14 is a block diagram showing still a further embodiment of a plasma processing apparatus according to the present invention.
Figure 15:
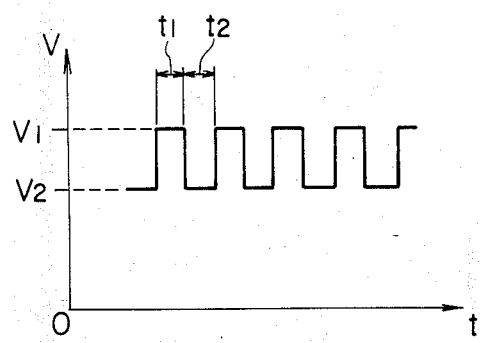
FIG. 15 is a waveform chart showing an example of a voltage applied to the grid electrode shown in FIG. 14, FIGS. 16A and 16B are schematic sectional views for a process of etching an Al film.

FIG. 14 shows still a further embodiment of a plasma processing apparatus according to the present invention. The present embodiment is different from the embodiment shown in FIG. 12, in that a grid electrode 60 is used as the ion acceleratng means. In the present embodiment, a signal generator 62 generates a D.C. signal having an A.C. component superposed thereon, that is, a signal having a waveform such as shown in FIG. 15. It is to be noted that the output signal of the signal generator 62 is not limited to the waveform shown in FIG. 15, but can take various waveforms.

The output signal of the signal generator 62 is amplified by a power amplifier 61 so as to have an amplitude of 100 to 1,000 V, and then applied to the grid electrode 60. Accordingly, in a period $t_1$ when the signal applied to the grid electrode 60 has a voltage $V_1$, the plasma ion drawn out of the processing chamber 60 is accelerated by a strong electric field, and thus a high-energy ion impinges on the wafer 53. While, in a period $t_2$ when the above signal has a voltage $V_2$ (smaller than $V_1$), a low-energy ion impinges on the wafer 53. Accordingly, the amount of the high-energy ion and the amount of the low-energy ion can be controlled by changing the application period $t_1$ of the voltage $V_1$ and the application period $t_2$ of the voltage $V_2$, respectively. Generally speaking, the energy distribution of plasma ion incident on the wafer can be freely controlled by changing the waveform of the signal applied to the grid electrode 60.

In the above, explanation has been made on the case where the generation of plasma and the acceleration of ion are separately controlled in a plasma processing apparatus using microwave discharge. However, it is needless to say that the plasma generation and ion acceleration can be separately controlled in a plasma processing apparatus using high-frequency discharge different from the microwave discharge.

In the above embodiments, the microwave or high-frequency signal has two amplitudes after amplitude modulation, as shown in FIG. 13. However, the present invention is not limited to such a case, but the above signal can take three or more amplitudes to make optimum the composition of plasma and to obtain the optimum ion energy distribution.

Further, it is not always required to amplitude-modulate the above signal, but the signal may be frequency-modulated as shown in FIGS. 9 and 10. Since the frequency-modulated, high-frequency or microwave signal can control plasma characteristics and ion energy distribution, the frequency modulation can produce the same effect as the amplitude modulation.

In the foregoing, a plasma processing method according to the present invention and the embodiments of a plasma processing apparatus according to the present invention have been explained. It can be readily seen from the foregong explanation that the present invention is applicable to all processing methods and apparatuses which utilize a plasma.

As has been explained in the foregoing, according to the present invention, the ion energy distribution (corresponding to the accelerated state of ion generated in a plasma) and the electron temperature distribution in the plasma (corresponding to the discharge state for producing the plasma) are controlled to adjust the kind and amount of each of the ion and radical produced in the plasma, thereby improving the plasma processing. That is, in the plasma etching, one of the etching rate, selectivity and etching accuracy can be remarkably improved. In the film deposition, one of the deposition rate and film quality can be improved. Further, a plasma processing apparatus according to the present invention is provided with discharge modulating means. Accordingly, the electron temperature distribution is controlled to adjust the kind and amount of each of the ion and radical produced in the plasma, therefore the characteristics of the plasma processing can be improved.

Further, some of plasma processng apparatuses according to the present invention include means for modulating a voltage applied between a plasma and a stage for supporting a wafer. Accordingly, the energy distribution of ion incident on the wafer can be controlled, and therefore the characteristics of the plasma processing are further improved.

We claim:

1. A plasma processing method comprising the steps of:
    introducing a processing gas into a reaction chamber having a sample disposed therein to keep a pressure inside said reaction chamber to a predetermined value;
    applying to said processing gas a plurality of different high-frequency voltage waveforms provided by a high-frequency power source for ionizing said processing gas to generate charged particles so that a distribution of values of a group of the charged particles with respect to ion energy of the charged particles periodically has at least two maximum values at a surface of the sample, said different voltage waveforms being determined by a voltage amplitude and a duty ratio; and
    processing the sample disposed inside said reaction chamber;
    wherein one of said plurality of different voltage waveforms for ionizing said processing gas to generate charged particles provides an energy distribution determined by a modulated voltage amplitude corresponding to an energy value of said charged particles and by a duty ratio corresponding to a group of said charge particles, and wherein a combination of said plurality of voltage waveforms provides such a distribution that a mean maximum energy value of said charged particle is allotted to each of a plurality of different predetermined ion energy regions wherein a predetermined amount of charged particles are possessed by each of said regions.

2. A plasma processing method according to claim 1, further comprising the step of applying to a holder of said sample disposed inside said reaction chamber said plurality of different voltage waveforms provided by said high-frequency power source for accelerating a part of said charged particles toward said object.

3. A plasma processing method according to claim 1, further comprising the steps of applying to a grid electrode provided inside said reaction chamber a plurality of different voltage waveforms provided by a power source for accelerating a part of said charged particles toward said sample disposed inside said reaction chamber.

4. A plasma processing method according to claim 1, wherein said predetermined value of pressure ranges from 5 Pa. to 14 Pa.

5. A plasma processing method according to claim 2, wherein said predetermined value of pressure ranges from 5 Pa. to 14 Pa.

6. A plasma processing method according to claim 3, wherein said predetermined value of pressure ranges from 5 Pa. to 14 Pa.

7. A plasma processing method according to claim 6, wherein said high-frequency power source has a frequency in the range of 0.5 to 20 MHz.

8. A plasma processing method according to claim 1, wherein said high-frequency power source has a frequency of 2.45 GHz.

9. A plasma processing method according to claim 2, wherein said high-frequency power source has a frequency of 2.45 GHz.

10. A plasma processing method according to claim 3, wherein said high-frequency power source has a frequency of 2.45 GHz.

11. A plasma processing method according to claim 1, wherein said voltage amplitude and said duty ratio are selected by an amplitude modulation.

12. A plasma processing method according to claim 2, wherein said voltage amplitude and said duty ratio are selected by an amplitude modulation.

13. A plasma processing method according to claim 3, wherein said voltage amplitude and said duty ratio are selected by an amplitude modulation.

14. A plasma processing method according to claim 1, wherein said voltage amplitude and said duty ratio are selected by a frequency modulation.

15. A plasma processing method according to claim 1, wherein said plurality of predetermined regions have a boundary to distribute energy required for removing an aluminum material lying on said object to be processed, for removing an underlying material, and for removing an oxide film on the surface to form a side wall.

16. A plasma processing method according to claim 1, wherein said predetermined amount of charged particles is determined by one of a duty ratio corresponding to the amount required for removing an aluminum material, an underlying material, and an oxide material on the surface, and a duty ratio corresponding to the amount required for forming a side wall.

17. A plasma processing apparatus comprising:
    introducing means for introducing a processing gas into a reaction chamber having a sample disposed therein;
    high-frequency power source means for applying a high frequency voltage to said processing gas to ionize said gas and generate charged particles;
    changing means for automatically changing an effective value of an amplitude of the high-frequency voltage during application of the high-frequency voltage so as to periodically provide at least two different effective values of the amplitude; and
    transfer means for transferring a power of said periodically changing high-frequency voltage of said high-frequency power source means as changed by said changing means to said reaction chamber so that a distribution of values of a group of the charged particles with respect to ion energy of the charged particles periodically has at least two maximum values at a surface of the sample.

18. A plasma processing apparatus according to claim 17, wherein said high-frequency power source means includes a standard signal generator, and said changing means includes a modulation signal generator and a modulator for applying a modulated signal to a high-frequency amplifier.

19. A plasma processing apparatus according to claim 18, wherein said modulator is an amplitude modulator and said transfer means includes one matching box.

20. A plasma processing apparatus according to claim 18, wherein said modulator is a frequency modulator and said transfer means includes a parallel connection of a matching box for transferring a high-frequency supplied from said standard signal generator and another matching box for transferring a high-frequency supplied from said modulation signal generator.

21. A plasma processing apparatus according to claim 18, wherein said modulation signal generator includes circuits for driving, attenuating, and adding a high-frequency.

22. A plasma processing apparatus according to claim 17, wherein said high-frequency power source means includes a standard signal generator and said changing means includes a modulation signal generator and a modulator for applying a modulated signal to a high-frequency amplifier coupled to a magnetron.

23. A plasma processing apparatus according to claim 22, wherein said modulator is in an amplitude modulator and said transfer means is a waveguide.

24. A plasma processing apparatus according to claim 17, further comprising extraction means for extracting said charged particles generated in said reaction chamber.

25. A plasma processing apparatus according to claim 24, wherein said extraction means comprises a power source including a high-frequency amplifier and a signal generator which are connected with a sample holder provided inside said reaction chamber through a matching box.

26. A plasma processing apparatus according to claim 24, wherein said extraction means comprises a power source including a grid electrode provided inside said reaction chamber, and a power amplifier and a signal generator connected to said grid electrode, said grid electrode having a voltage in the form of a periodic square wave applied thereto.

27. A plasma processing apparatus comprising:
introducing means for introducing a processing gas into a reaction chamber having a sample disposed therein;
high-frequency power source means for applying a high-frequency voltage to said processing gas to ionize said gas and generate charged particles;
extraction means for extracting said charged particles generated in said reaction chamber, said extraction means including changing means for automatically changing an effective value of an amplitude of the high-frequency voltage so as to enable extraction of said charged particles during application of the high-frequency voltage and to periodically provide at least two different effective values of the amplitude; and
transfer means for transferring a power of said periodically changing high-frequency voltage as changed by said changing means to said extraction means so that a distribution of values of a group of said charged particles with respect to energy of said charged particles periodically has at least two maximum values at a surface of said sample.

28. A plasma processing apparatus according to claim 27, wherein said high-frequency power source means comprises microwave generating means for generating a microwave electric field.

29. A plasma processing apparatus according to 28, wherein said extraction means is connected with sample holding means for holding said sample.

30. A plasma processing apparatus according to claim 28, wherein said extraction means is connected with a grid electrode provided inside said reaction chamber.

* * * * *